US012581659B2

(12) United States Patent
Xu et al.

(10) Patent No.: US 12,581,659 B2
(45) Date of Patent: Mar. 17, 2026

(54) FERROELECTRIC MEMORY AND STORAGE DEVICE

(71) Applicant: HUAWEI TECHNOLOGIES CO., LTD., Shenzhen (CN)

(72) Inventors: Jeffrey Junhao Xu, Shenzhen (CN); Weiliang Jing, Shanghai (CN); Sitong Bu, Shenzhen (CN); Yichen Fang, Beijing (CN); Ying Wu, Shanghai (CN); Zhaozhao Hou, Shenzhen (CN); Wanliang Tan, Shenzhen (CN); Heng Zhang, Beijing (CN); Yu Zhang, Shanghai (CN)

(73) Assignee: Huawei Technologies Co., Ltd., Shenzhen (CN)

(*) Notice: Subject to any disclaimer, the term of this patent is extended or adjusted under 35 U.S.C. 154(b) by 372 days.

(21) Appl. No.: 18/311,598

(22) Filed: May 3, 2023

(65) Prior Publication Data

US 2023/0276636 A1 Aug. 31, 2023

Related U.S. Application Data

(63) Continuation of application No. PCT/CN2020/126589, filed on Nov. 4, 2020.

(51) Int. Cl.
*H10B 53/30* (2023.01)
*H10B 53/20* (2023.01)

(52) U.S. Cl.
CPC ............. *H10B 53/30* (2023.02); *H10B 53/20* (2023.02)

(58) Field of Classification Search
CPC ........ H10B 53/20; H10B 53/30; H10B 53/50; H10B 51/20; H10B 51/30
USPC ........................................................ 257/295
See application file for complete search history.

(56) References Cited

U.S. PATENT DOCUMENTS

| | | | | |
|---|---|---|---|---|
| 6,188,600 | B1 * | 2/2001 | Ishiwara | H10B 53/00 257/E27.104 |
| 6,327,172 | B1 | 12/2001 | Ishiwara | |
| 7,983,067 | B2 * | 7/2011 | Kitazaki | H10D 1/682 257/E21.001 |
| 11,107,515 | B2 * | 8/2021 | Derner | G11C 11/2275 |

(Continued)

FOREIGN PATENT DOCUMENTS

| | | |
|---|---|---|
| CN | 1059798 A | 3/1992 |
| CN | 1246709 A | 3/2000 |

(Continued)

OTHER PUBLICATIONS

International Search Report and Written Opinion in International Appln. No. PCT/CN2020/126589, mailed on Aug. 9, 2021, 19 pages (with English translation).

(Continued)

*Primary Examiner* — Jami Valentine Miller
(74) *Attorney, Agent, or Firm* — Fish & Richardson P.C.

(57) ABSTRACT

Example ferroelectric memories and storage devices are described. One example ferroelectric memory includes at least one bit cell. A bit cell in the at least one bit cell includes a plurality of ferroelectric capacitors and a first transistor. The first transistor includes a first gate, a first channel, a first source, and a first drain. The first source and the first drain are located at two ends of the first channel. One electrode of each of the plurality of ferroelectric capacitors is formed on the first gate.

19 Claims, 9 Drawing Sheets

(56)                    References Cited

U.S. PATENT DOCUMENTS

| 2001/0000688 | A1* | 5/2001 | Ishiwara | H10B 53/00 |
| | | | | 257/E27.104 |
| 2002/0027798 | A1* | 3/2002 | Takashima | G11C 11/22 |
| | | | | 257/E27.104 |
| 2002/0044477 | A1* | 4/2002 | Takeuchi | G11C 11/22 |
| | | | | 365/145 |
| 2010/0124092 | A1* | 5/2010 | Hashimoto | G11C 11/22 |
| | | | | 365/65 |
| 2022/0199635 | A1* | 6/2022 | Shivaraman | H10B 53/20 |

FOREIGN PATENT DOCUMENTS

| CN | 103872055 | A | 6/2014 |
| CN | 105514109 | A | 4/2016 |
| CN | 108110007 | A | 6/2018 |
| KR | 20190038673 | A | 4/2019 |

OTHER PUBLICATIONS

Koo et al., "Characteristics of Paired Bi(4-X) LaXTi3O12 (BLT) Capacitors Suitable For 1T2C-Type FeRAM," Japanese Journal Of Applied Physics, vol. 42, No. 5A, Part 01, May 2003, pp. 2660-2666.
Extended European Search Report in European Appln No. 20960276.2, dated Oct. 19, 2023, 9 pages.
Office Action in Korean Appln. No. 10-2023-7017812, mailed on Aug. 14, 2024, 21 pages (with English machine translation).

* cited by examiner (a)                                              (b)

(a)

(b)

FERROELECTRIC MEMORY AND STORAGE DEVICE

CROSS-REFERENCE TO RELATED APPLICATIONS

This application is a continuation of International Application No. PCT/CN2020/126589, filed on Nov. 4, 2020, the disclosure of which is hereby incorporated by reference in its entirety.

TECHNICAL FIELD

This application relates to the field of data storage technologies, and in particular, to a ferroelectric memory and a storage device.

BACKGROUND

Currently, a dynamic random access memory (DRAM) has become an indispensable main memory for high-performance computing, and a requirement for a storage capacity of the DRAM is growing exponentially every year in the market. However, only scaling-down of a 14 nm node can be technically implemented for the DRAM. A requirement for a larger storage capacity can be achieved only by stacking a plurality of DRAM chips. This causes problems of a large area, high costs, and high power consumption of the entire memory. In this case, a ferroelectric random access memory (ferroelectric random access memory, FRAM) emerges. The ferroelectric random access memory may also be referred to as a ferroelectric memory and is a type of memory made according to a principle that a polarization direction of a ferroelectric material changes under an action of an electric field. The ferroelectric random access memory has advantages such as a fast reading/writing speed, low power consumption, and a small area.

In a conventional technology, as shown in FIG. 1, a structure in which a ferroelectric capacitor is serially connected to a drain (drain, D) of a transistor, that is, a 1T1C (1 transistor-1 capacitor) structure, is generally used in a memory cell in the ferroelectric memory. In FIG. 1, S represents a source (source), G represents a gate (gate), and FE represents a ferroelectric dielectric. Although this structure has advantages of high durability and a low operating voltage, a scale-down capability is limited, making it difficult to be technically applicable to a node smaller than 14 nm.

SUMMARY

This application provides a ferroelectric memory and a storage device, to increase a density and improve a scale-down capability of a memory cell, and further reduce an area of the ferroelectric memory.

To achieve the foregoing objective, this application uses the following technical solutions.

According to a first aspect, a ferroelectric memory is provided. The ferroelectric memory includes at least one bit cell, and the bit cell in the at least one bit cell includes a plurality of ferroelectric capacitors and a first transistor. The first transistor may be a gate-all-around transistor. For example, the first transistor is a vertical nanowire transistor. The first transistor includes a first gate, a first channel, and a first source and a first drain that are located at two ends of the first channel. The first gate may be in a floating (floating) state. That is, the first gate is in a suspended state without a conducting wire, the first channel CH1 may be columnar, and one electrode of each of the plurality of ferroelectric capacitors is formed on the first gate.

In the foregoing technical solution, each bit cell in the ferroelectric memory includes one first transistor and a plurality of ferroelectric capacitors. The first transistor includes the first gate, the first channel, and the first source and the first drain that are located at two ends of the first channel. The electrode of each of the plurality of ferroelectric capacitors is formed on the first gate included in the first transistor. In this way, each ferroelectric capacitor may be equivalent to one memory cell. That is, a plurality of memory cells may be integrated on one first transistor, to increase a density and improve a scale-down capability of the plurality of memory cells, and further reduce an area of the ferroelectric memory.

In a possible implementation of the first aspect, the ferroelectric memory further includes a bit line, a source line, and a plurality of word lines. The first source is connected to the source line, the first drain is connected to the bit line, and other electrodes of the plurality of ferroelectric capacitors are respectively connected to the plurality of word lines. In the foregoing possible implementation, different voltages are respectively applied to the bit line, the source line, and the word lines, so that the memory cells formed by the plurality of ferroelectric capacitors can be read or written.

In a possible implementation of the first aspect, the ferroelectric memory further includes a first voltage line, a second voltage line, and a plurality of third voltage lines. The first source is connected to the first voltage line, the first drain is connected to the second voltage line, and other electrodes of the plurality of ferroelectric capacitors are respectively connected to the plurality of third voltage lines. In the foregoing possible implementation, different voltages are respectively applied to the first voltage line, the second voltage line, and the plurality of third voltage lines, so that the memory cells formed by the plurality of ferroelectric capacitors can be read or written.

In a possible implementation of the first aspect, the electrode of each of the plurality of ferroelectric capacitors is the first gate. In other words, the first gate is directly used as the one electrode of each of the plurality of ferroelectric capacitors. In the foregoing possible implementation, the first gate is directly used as one electrode of each of the plurality of ferroelectric capacitors, so that the scale-down capability of the memory cells formed by the plurality of ferroelectric capacitors can be further improved.

In a possible implementation of the first aspect, the plurality of ferroelectric capacitors include at least one first capacitor and at least one second capacitor. The at least one first capacitor and the at least one second capacitor are respectively formed on two surfaces that are disposed opposite to each other and that are of the first gate. For example, the at least one first capacitor is formed on a surface of the first gate close to the first source, and the at least one second capacitor is formed on a surface of the first gate away from the first source. In the foregoing possible implementation, the plurality of ferroelectric capacitors are formed on the two surfaces that are disposed opposite to each other and that are of the first gate, so that a quantity of more ferroelectric capacitors can be integrated on the first transistor, that is, a quantity of more memory cells are integrated on one first transistor, to further increase the density of the plurality of memory cells.

In a possible implementation of the first aspect, the plurality of ferroelectric capacitors and the first transistor are disposed at a metal wiring layer, that is, the ferroelectric memory is formed by using a back end of line process, so that the ferroelectric memory and various controllers may be formed by using a same process. In the foregoing possible implementations, a process of forming the ferroelectric memory may be simplified, so that better integration with a memory is implemented, and an area of the ferroelectric memory can be further reduced.

In a possible implementation of the first aspect, the ferroelectric memory further includes a second transistor. The second transistor includes a second gate, a second channel, and a second source and a second drain that are located at two ends of the second channel. The second source is connected to the first gate, the second drain is connected to the first drain, and the second gate is configured to receive a control signal. In the foregoing possible implementation, when data is read from the memory cells formed by the plurality of ferroelectric capacitors, the second transistor may be turned on by controlling the control signal, to precharge the second gate of the second transistor.

In a possible implementation of the first aspect, the at least one bit cell includes a first bit cell and a second bit cell. The first bit cell and the second bit cell are located at a same layer. For example, when the first bit cell and the second bit cell are located at the same layer, a source line SL and a bit line BL of the first bit cell may be respectively connected to a source line SL and a bit line BL of the second bit cell, or the source line SL and the bit line BL of the first bit cell may be respectively connected to the source line SL and the bit line BL of the second bit cell. In the foregoing possible implementation, in the foregoing manner of sharing a source line SL or a bit line BL, a quantity of connection lines of the source line SL or the bit line BL may be reduced, to ensure small layout area overheads. In addition, sharing the source line SL or the bit line BL can reduce manufacturing costs. However, a reading/writing bandwidth is determined by a single-layer memory cell array, and the reading/writing bandwidth cannot be expanded in a multi-layer stacking manner.

In a possible implementation of the first aspect, the at least one bit cell includes a first bit cell and a second bit cell. The first bit cell and the second bit cell may be disposed at different layers in a stacking manner. For example, when the first bit cell and the second bit cell are disposed in a stacking manner, a source line SL of the first bit cell may be reused as a source line SL of the second bit cell, or the ferroelectric memory further includes an isolation layer disposed between the first bit cell and the second bit cell. In the foregoing possible implementation, disposing in a stacking manner can ensure small layout area overheads, and a stacking manner by disposing the isolation layer can further expand a reading/writing bandwidth. The reading/writing bandwidth may be in direct proportion to a quantity of stacking layers.

In a possible implementation of the first aspect, the plurality of ferroelectric capacitors correspondingly form a plurality of memory cells. When data is written into a target memory cell in the plurality of memory cells, a voltage difference between the first source and the first drain is equal to 0, and an absolute value of a voltage difference between the other electrode of a ferroelectric capacitor corresponding to the target memory cell and the first drain is equal to a first specified voltage. In the foregoing possible implementation, data can be written into the target memory cell, and when the voltage difference between the first source and the first drain is equal to 0, a leakage current of a write operation can be suppressed.

In a possible implementation of the first aspect, an electrode of a ferroelectric capacitor that corresponds to the target memory cell other than the target memory cell and that is in the plurality of ferroelectric capacitors and the first drain are in a floating state, or an absolute value of a voltage difference between the two is less than one half of the first specified voltage. In the foregoing possible implementation, it can be ensured that a state of an unselected memory cell is not affected in a process of writing data.

In a possible implementation of the first aspect, the plurality of ferroelectric capacitors form the plurality of memory cells. When data is read from the target memory cell in the plurality of memory cells, a bias voltage of the first source is 0, a bias voltage of the first drain is a second specified voltage, and a bias voltage of the electrode of the ferroelectric capacitor corresponding to the target memory cell is a third specified voltage. Optionally, after the data is read, data of the target memory cell may be further written back. In the foregoing possible implementation, data can be read from the target memory cell, and after completion of reading the data, it can be ensured that data in the target memory cell is consistent before and after a read operation is performed.

In a possible implementation of the first aspect, the electrode of the ferroelectric capacitor that corresponds to the memory cell other than the target memory cell and that is in the plurality of memory cells is in the floating state or is grounded. In the foregoing possible implementation, it can be ensured that a state of an unselected memory cell in a bit cell is not affected in a process of reading data.

According to a second aspect, a ferroelectric memory is provided. The ferroelectric memory includes at least one bit cell, and the bit cell in the at least one bit cell includes a plurality of ferroelectric capacitors and a first transistor. The first transistor may be a gate-all-around transistor. For example, the first transistor is a vertical nanowire transistor. The first transistor includes a first gate, a first channel, and a first source and a first drain that are located at two ends of the first channel. The first gate may be in a floating (floating) state. That is, the first gate is in a suspended state without a conducting wire, the first channel CH1 may be columnar, and one electrode of each of the plurality of ferroelectric capacitors is formed on one of the first source or the first drain. In the foregoing technical solution, one electrode of each of the plurality of ferroelectric capacitors is formed on one of the first source or the first drain, so that each ferroelectric capacitor may be equivalent to one memory cell. That is, a plurality of memory cells may be integrated on one first transistor, to increase a density and improve a scale-down capability of the plurality of memory cells, and further reduce an area of the ferroelectric memory.

In a possible implementation of the second aspect, other electrodes of the plurality of ferroelectric capacitors are respectively coupled to a plurality of source lines or a plurality of bit lines. For example, if one electrode of each of the plurality of ferroelectric capacitors is formed on the first source, and the ferroelectric memory further includes the plurality of source lines, the plurality of bit lines, and a plurality of word lines, the first gate is connected to the word lines, the first drain is connected to the bit lines, and another electrode of each of the plurality of ferroelectric capacitors is coupled to each of the plurality of source lines. Alternatively, if one electrode of each of the plurality of ferroelectric capacitors is formed on the first drain, and the ferroelectric memory further includes the plurality of bit lines, the plurality of source lines, and a plurality of word lines, the first gate is connected to the word lines, the first source is connected to the source lines, and another electrode of each of the plurality of ferroelectric capacitors is coupled to each of the plurality of bit lines. In the foregoing possible implementation, different voltages are respectively applied to the bit lines, the source lines, and the word lines, so that the memory cells formed by the plurality of ferroelectric capacitors can be read or written.

In a possible implementation of the second aspect, one electrode of each of the plurality of ferroelectric capacitors is the first source. In other words, the first source is directly used as one electrode of each of the plurality of ferroelectric capacitors. Alternatively, one electrode of each of the plurality of ferroelectric capacitors is the first drain. In other words, the first drain is directly used as one electrode of each of the plurality of ferroelectric capacitors. In the foregoing possible implementation, the first source or the first drain is directly used as one electrode of each of the plurality of ferroelectric capacitors, so that the scale-down capability of the memory cells formed by the plurality of ferroelectric capacitors can be further reduced.

According to a third aspect, a storage device is provided. The storage device includes a circuit board and a ferroelectric memory connected to the circuit board. The ferroelectric memory is the ferroelectric memory provided in the first aspect, any possible implementation of the first aspect, or the second aspect.

According to a fourth aspect, a storage device is provided. The storage device includes a controller and a ferroelectric memory. The controller is configured to control reading/writing in the ferroelectric memory. The ferroelectric memory is the ferroelectric memory provided in the first aspect, any possible implementation of the first aspect, or the second aspect.

It may be understood that any storage device provided above, a non-transitory computer-readable storage medium used with a computer, and the like, include a same or corresponding feature of the ferroelectric memory provided above. Therefore, for beneficial effects that can be achieved by them, refer to beneficial effects in a corresponding integrated circuit provided above, and details are not described herein again.

DESCRIPTION OF EMBODIMENTS

Construction and practice of various embodiments are discussed in detail below. However, it should be understood that a plurality of applicable inventive concepts provided in this application can be implemented in a plurality of specific environments. The specific embodiments discussed are merely illustrative of specific manners to implement and use the specification and the technologies, and do not limit the scope of this application.

Unless defined otherwise, all technical and scientific terms used in this specification have the same meaning as commonly understood by a person of ordinary skill in the art.

Each circuit or another component may be described as or referred to as "configured to" perform one or more tasks. In this case, "configured to" is used to imply a structure by indicating that the circuit/component includes a structure (for example, a circuit system) that performs one or more tasks during operation. Therefore, the circuit/component can be referred to as being configured to perform the task even when the specified circuit/component is not currently operational (for example, is not on). The circuit/component used with the term "configured to" includes hardware, for example, a circuit that performs an operation.

The following describes the technical solutions in embodiments of this application with reference to the accompanying drawings in embodiments of this application. In this application, "at least one" means one or more, and "a plurality of" means two or more. The term "and/or" describes an association relationship between associated objects, and indicates that three relationships may exist. For example, A and/or B may indicate the following three cases: A exists alone, both A and B exist, and B exists alone, where A and B may be singular or plural. The character "/" generally indicates an "or" relationship between the associated objects. "At least one of the following items (pieces)" or a similar expression thereof refers to any combination of these items, including any combination of singular items (pieces) or plural items (pieces). For example, at least one of a, b, or c may represent: a, b, c, a and b, a and c, b and c, or a, b, and c, where a, b, and c may be singular or plural.

In addition, in embodiments of this application, the terms such as "first" and "second" are not intended to limit a quantity or an execution sequence.

It should be noted that, in this application, words "example" or "for example" are used to represent giving an example, an illustration, or a description. Any embodiment or design scheme described as an "example" or "for example" in this application should not be explained as being more preferred or having more advantages than another embodiment or design scheme. Exactly, use of the word such as "example" or "for example" is intended to present a relative concept in a specific manner.

Figure 2:
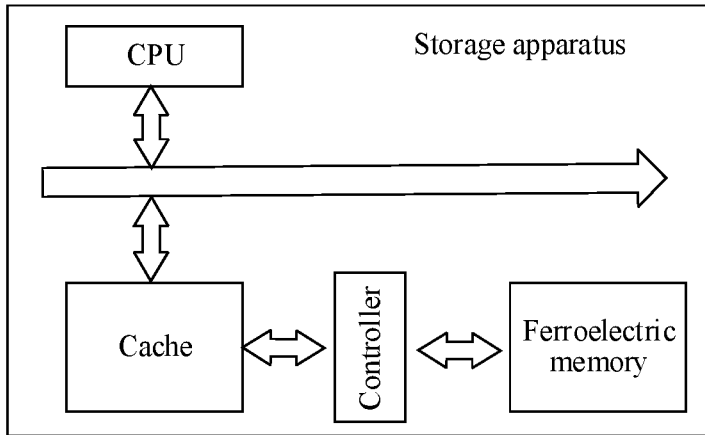
FIG. 2 is a schematic diagram of a structure of a storage apparatus according to an embodiment of this application.

The technical solutions of this application may be applied to various storage systems using a ferroelectric memory. For example, the technical solutions of this application may be applied to a computer, or may be applied to a storage system including a memory, or may be applied to a storage system including a processor and a memory. The processor may be a central processing unit (central processing unit, CPU), an artificial intelligence (artificial intelligence, AI) processor, a digital signal processor (digital signal processor), a neural network processor, or the like. For example, FIG. 2 is a schematic diagram of a structure of a storage system according to an embodiment of this application. The storage system may include a ferroelectric memory. Optionally, the storage system may further include a CPU, a cache (cache), a controller, and the like. The CPU, the cache, the controller, and the ferroelectric memory may be integrated together. The ferroelectric memory may be coupled to the cache through the controller, and may be coupled to the CPU through the cache.

Figure 3:
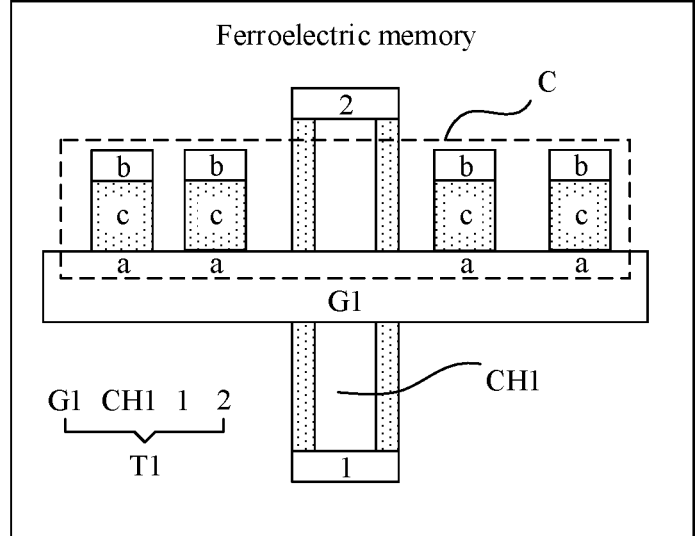
FIG. 3 is a schematic diagram of a structure of a ferroelectric memory according to an embodiment of this application.

FIG. 3 is a schematic diagram of a structure of a ferroelectric memory according to an embodiment of this application. The ferroelectric memory includes at least one bit cell. Each of the at least one bit cell includes a first transistor T1 and a plurality of ferroelectric capacitors C. A quantity of the plurality of ferroelectric capacitors C may be n, where n is a positive integer. In this embodiment of this application, the first transistor T1 includes a first gate G1, a first channel CH1, and a first source 1 and a first drain 2 that are located at two ends of the first channel CH1, and one electrode a of each of the plurality of ferroelectric capacitors C is formed on the first gate G1. FIG. 3 is described by using an example in which the quantity n of the plurality of ferroelectric capacitors C is equal to 4, and a structure of each bit cell may also be referred to as a 1TnC structure.

The first transistor T1 may be a gate-all-around (gate-all-around, GAA) transistor. The first gate G1 may be in a floating (floating) state, that is, the first gate G1 is in a suspended state without a conducting wire. The first channel CH1 may be columnar. During actual application, the first transistor T1 may alternatively be a transistor of another structure or type. This is not specifically limited in this embodiment of this application. In this embodiment of this application, only an example in which the first transistor T1 is the GAA transistor is used for description.

In addition, each of the plurality of ferroelectric capacitors C includes two electrodes (where one electrode is a and the other electrode is b) and a ferroelectric dielectric c located between the two electrodes a and b. The ferroelectric dielectric c may be made of a ferroelectric material. For example, the ferroelectric material may be hafnium zirconium oxide ($HfZrO_2$). That one electrode a of each of the plurality of ferroelectric capacitors C is formed on the first gate G1 may mean that the first gate G1 is directly used as one electrode a of each of the plurality of ferroelectric capacitors C; or a metal plate is formed on the first gate G1, and the metal plate is used as one electrode a of each of the plurality of ferroelectric capacitors C.

In this embodiment of this application, each bit cell in the ferroelectric memory includes one first transistor T1 and a plurality of ferroelectric capacitors C. The first transistor T1 includes the first gate G1, the first channel CH1, and the first source 1 and the first drain 2 that are located at the two ends of the first channel CH1. One electrode a of each of the plurality of ferroelectric capacitors C is formed on the first gate G1 included in the first transistor T1. In this way, each ferroelectric capacitor may be equivalent to one memory cell. That is, a plurality of memory cells may be integrated on one first transistor T1, to increase a density and improve a scale-down capability of the plurality of memory cells, and further reduce an area of the ferroelectric memory.

Figure 4:
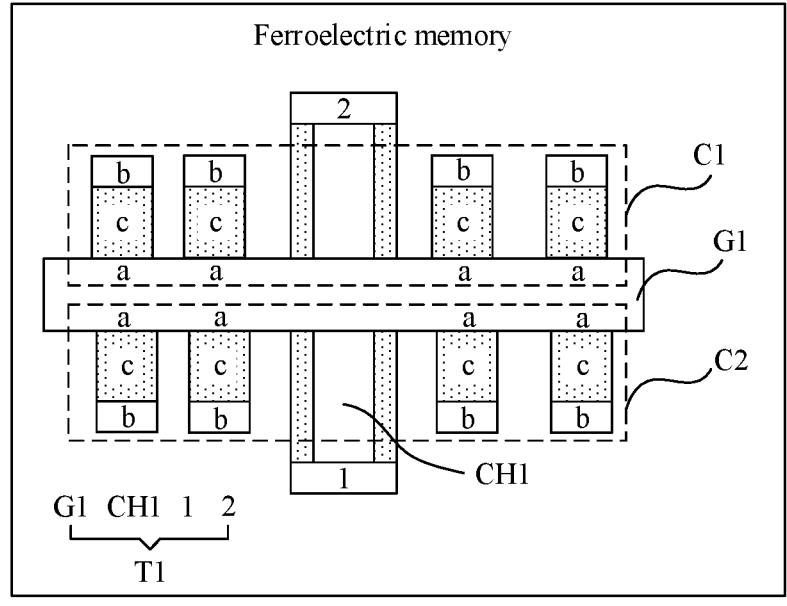
FIG. 4 is a schematic diagram of a structure of another ferroelectric memory according to an embodiment of this application.

Optionally, as shown in FIG. 4, a plurality of ferroelectric capacitors C may include at least one first capacitor C1 and at least one second capacitor C2. The at least one first capacitor C1 and the at least one second capacitor C2 are respectively formed on two surfaces that are disposed opposite to each other and that are of a first gate G1. For example, the at least one first capacitor C1 is formed on a surface of the first gate G1 close to a first source 1, and the at least one second capacitor C2 is formed on a surface of the first gate G1 away from the first source 1. FIG. 4 is described by using an example in which a quantity n of the plurality of ferroelectric capacitors C is equal to 8. The plurality of ferroelectric capacitors C are formed on the two surfaces that are disposed opposite to each other and that are of the first gate G1, so that more ferroelectric capacitors can be integrated on a first transistor T1, that is, more memory cells are integrated on one first transistor T1, to further increase a density of a plurality of memory cells.

Figure 5:
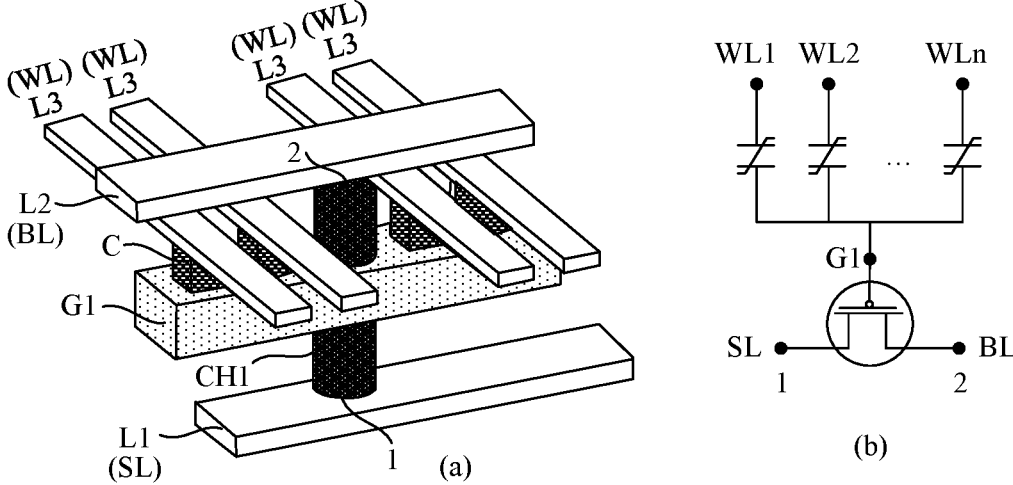
FIG. 5 is a schematic diagram of a structure of still another ferroelectric memory according to an embodiment of this application.

Further, as shown in (a) in FIG. 5, each of the at least one bit cell may further include a first voltage line L1, a second voltage line L2, and a plurality of third voltage lines L3. A first source 1 is connected to the first voltage line L1, a first drain 2 is connected to the second voltage line L2, and other electrodes b of the plurality of ferroelectric capacitors C are respectively connected to the plurality of third voltage lines L3, that is, another electrode b of one ferroelectric capacitor is connected to one third voltage line L3. Optionally, the first voltage line L1 is parallel to the second voltage line L2, and the second voltage line L2 is perpendicular to the plurality of third voltage lines L3. It should be noted that FIG. 5 is described by using an example in which the plurality of ferroelectric capacitors C are formed on one surface of a first gate G1. This is also applicable to a case in which the plurality of ferroelectric capacitors C are formed on two surfaces that are disposed opposite to each other and that are of the first gate G1.

In an example, as shown in (a) in FIG. 5, the first voltage line L1 may be a source line (source line, SL), the second voltage line L2 may be a bit line (bit line, BL), and the third voltage lines L3 may be word lines (word lines, WLs). The first voltage line L1 is not in contact with the third voltage lines L3. For example, the first voltage line L1 and the third voltage lines L3 may be located at different layers. The following descriptions are all made by using an example in which the first voltage line L1 is the source line SL, the second voltage line L2 is the bit line BL, and the third voltage lines L3 are the word lines WLs. (b) in FIG. 5 is a diagram of an equivalent circuit of a bit cell according to an embodiment of this application. A plurality of word lines WL are represented as a WL1 to a WLn.

It should be noted that a source line SL herein may be understood as another type of bit line BL. In other words, a function of the source line SL is similar to a function of the bit line BL, and a plurality of memory cells connected to one source line SL and one bit line BL may be selected using the source line SL and the bit line BL.

Further, when the at least one bit cell includes a plurality of bit cells, the plurality of bit cells may be located at a same layer, or may be disposed at different layers in a stacking manner. The following provides descriptions by using an example in which the at least one bit cell includes a first bit cell and a second bit cell.

Figure 6:
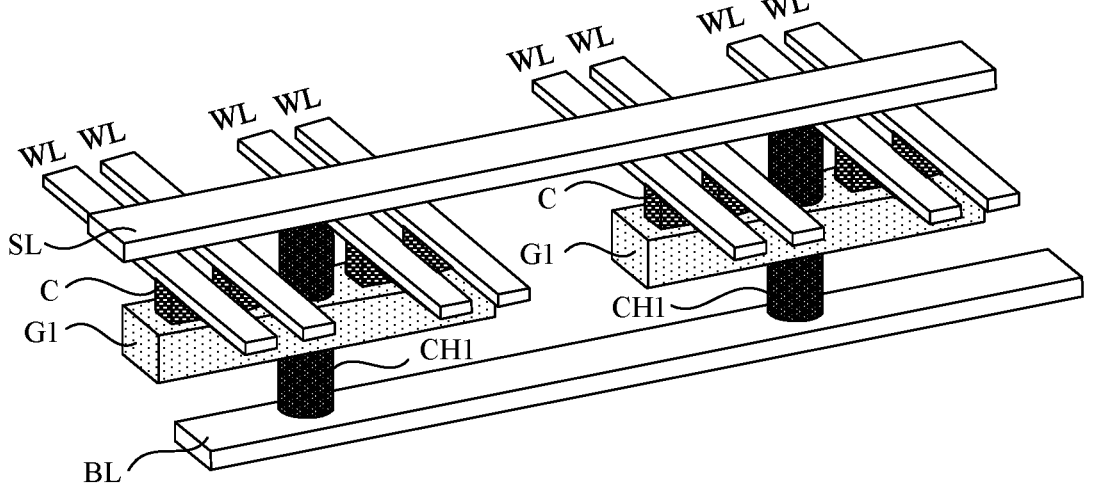
FIG. 6 is a schematic diagram of a structure of yet another ferroelectric memory according to an embodiment of this application.
Figure 7:
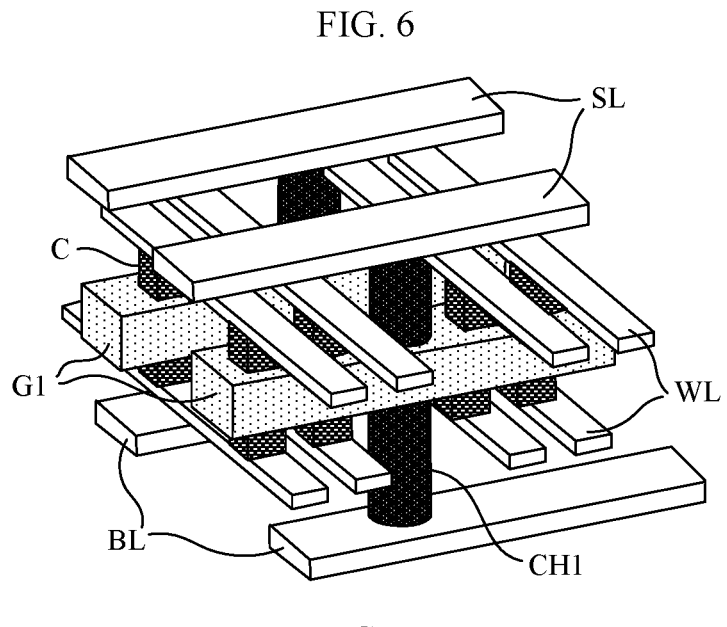
FIG. 7 is a schematic diagram of a structure of still yet another ferroelectric memory according to an embodiment of this application.
Figure 8:
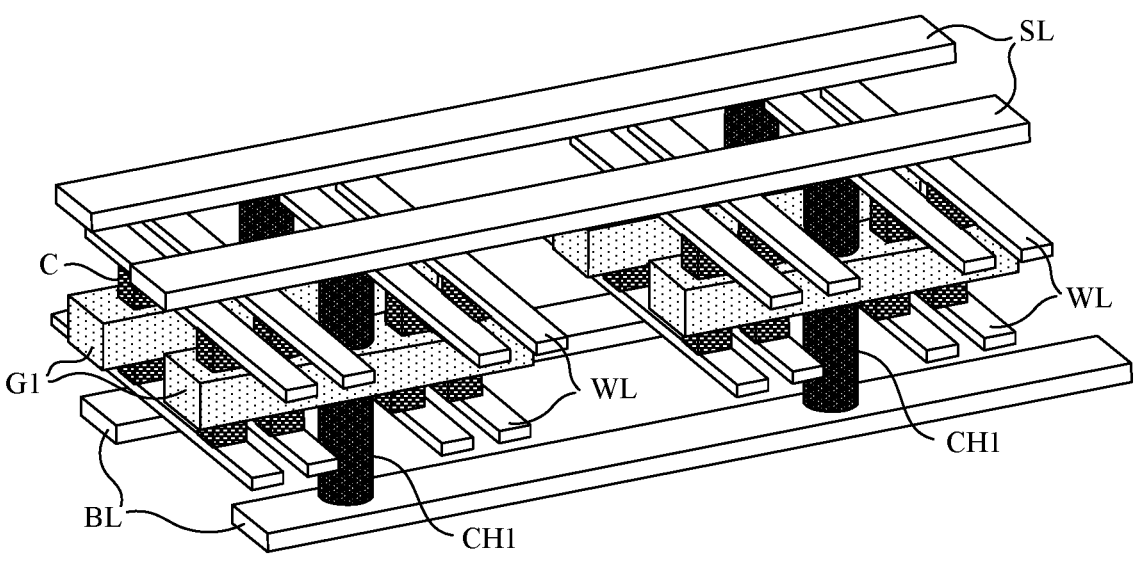
FIG. 8 is a schematic diagram of a structure of a further ferroelectric memory according to an embodiment of this application.

In a first embodiment, when the first bit cell and the second bit cell are located at a same layer, as shown in FIG. 6, a source line SL and a bit line BL of the first bit cell may be respectively connected to a source line SL and a bit line BL of the second bit cell. Alternatively, when the first bit cell and the second bit cell are located at a same layer, as shown in FIG. 7, a plurality of word lines WLs of the first bit cell may be respectively connected to a plurality of word lines WLs of the second bit cell. Further, when the at least one bit cell includes more than two bit cells, as shown in FIG. 8, a ferroelectric memory including a memory cell array may be formed in the foregoing two manners, and the memory cell array may include a plurality of rows and a plurality of columns of memory cells.

Figure 9:
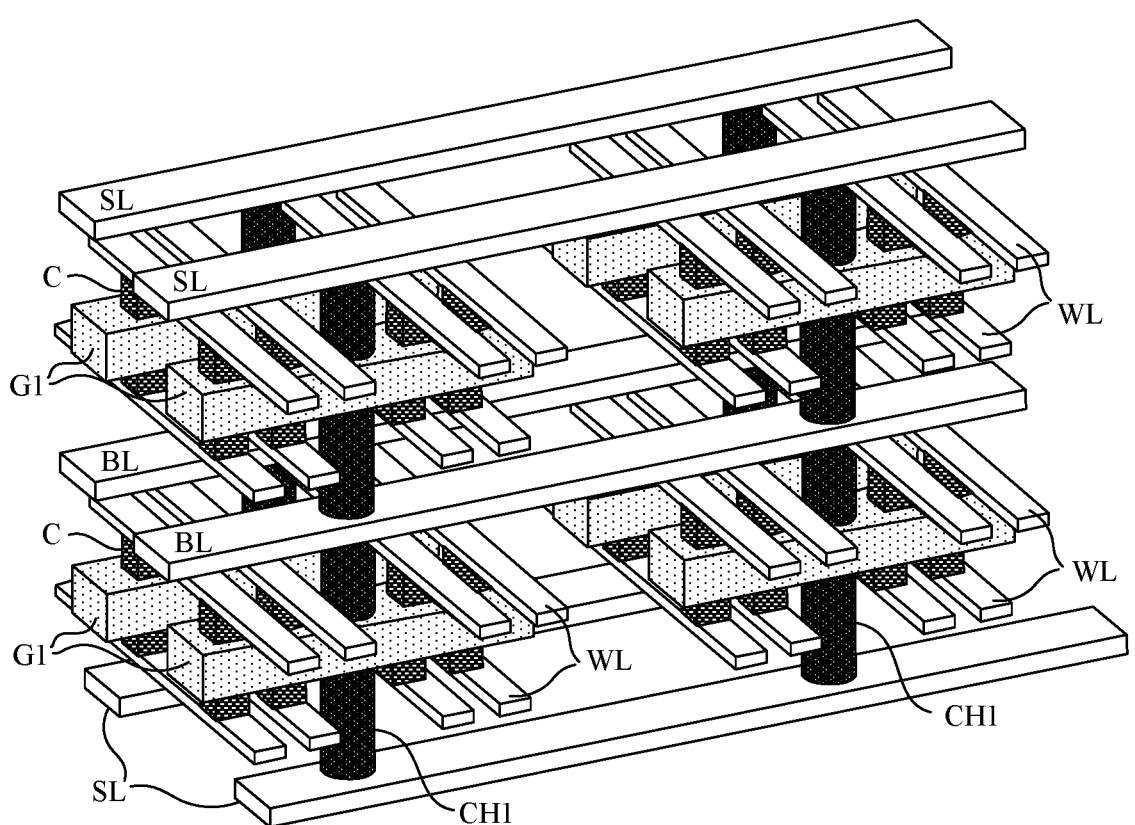
FIG. 9 is a schematic diagram of a structure of a still further ferroelectric memory according to an embodiment of this application.
Figure 10:
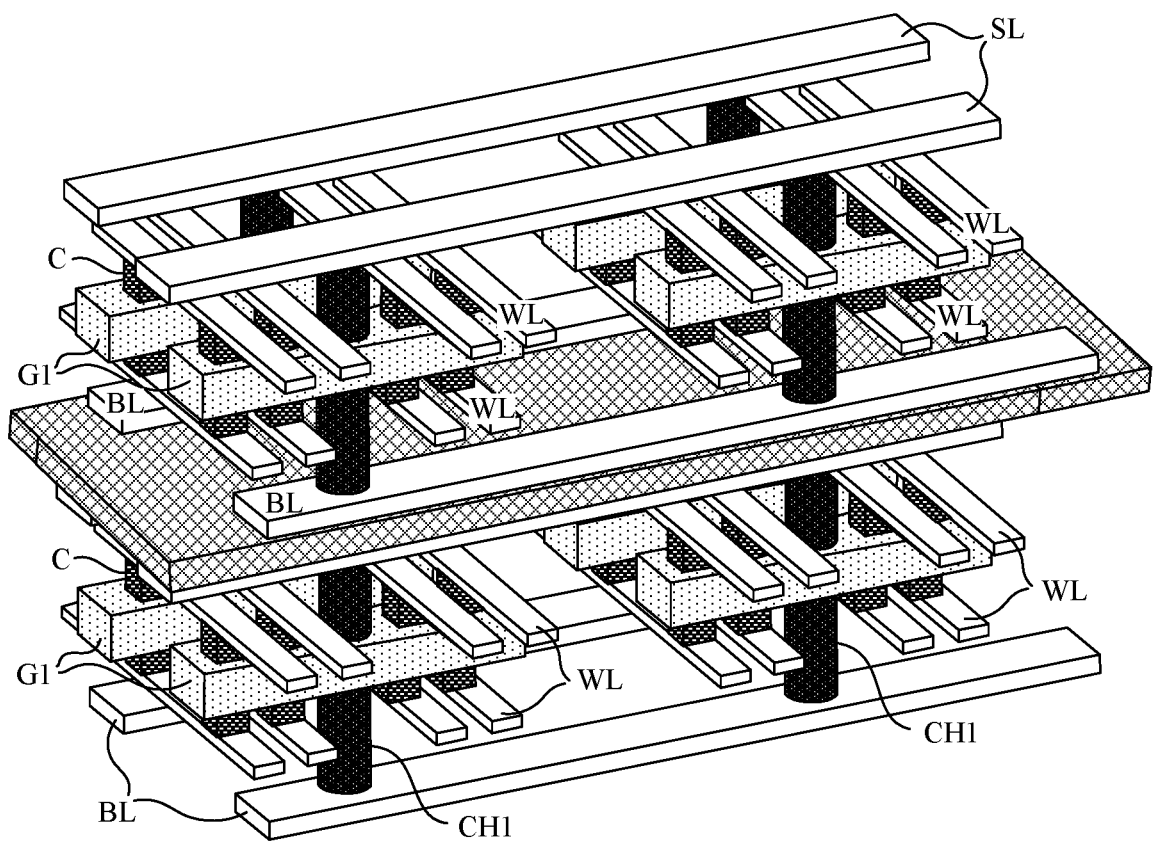
FIG. 10 is a schematic diagram of a structure of a yet further ferroelectric memory according to an embodiment of this application.

In a second embodiment, as shown in FIG. 9, when the first bit cell and the second bit cell are disposed at different layers in a stacking manner, a source line SL of the first bit cell may be reused as a source line SL of the second bit cell. That is, the first bit cell and the second bit cell share a same source line SL, or the first bit cell and the second bit cell share a same bit line BL. Alternatively, as shown in FIG. 10, when the first bit cell and the second bit cell are disposed at different layers in a stacking manner, the ferroelectric memory further includes an isolation layer disposed between the first bit cell and the second bit cell, so that each bit cell has a respective source line SL, a respective bit line BL, and respective word lines WLs. In the foregoing manner of sharing the source line SL or the bit line BL, a quantity of connection lines of the source line SL or the bit line BL may be reduced, to ensure small layout area overheads. In addition, sharing the source line SL or the bit line BL can reduce manufacturing costs. However, a reading/writing bandwidth is determined by a single-layer memory cell array, and the reading/writing bandwidth cannot be expanded in a multi-layer stacking manner. The foregoing manner of disposing the isolation layer can also ensure the small layout area overheads. In addition, the stacking manner can expand the reading/writing bandwidth. The reading/writing bandwidth may be in direct proportion to a quantity of stacking layers.

Further, when the at least one bit cell includes a plurality of bit cells, a multi-layer memory cell array disposed in a stacking manner may be obtained with reference to a manner of combining different bit cells in the foregoing two embodiments, to further increase a density and improve a scale-down capability of a plurality of memory cells in the ferroelectric memory, and reduce an area of the ferroelectric memory. It is obtained through actual measurement that a minimum area of a memory cell that can be implemented for the memory cell array provided in the ferroelectric memory is $4F^2$, and an area of a scale-down equivalent memory cell that can be implemented for a stacking structure-based ferroelectric memory is $2F^2$, $1.33F^2$, $1F^2$, or the like.

Figure 11:
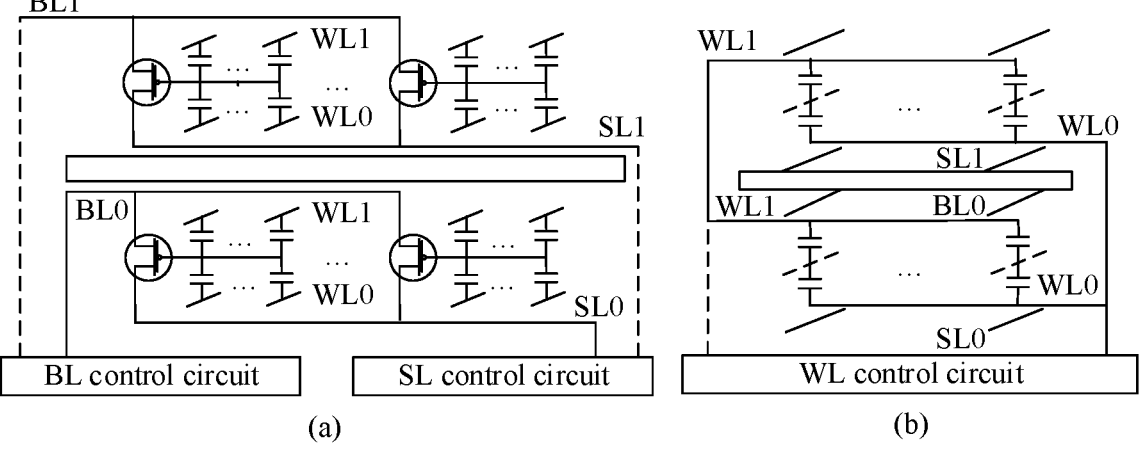
FIG. 11 is a schematic diagram of a connection of a control circuit according to an embodiment of this application.

Further, as shown in (a) and (b) in FIG. 11, when a three-dimensional stacked ferroelectric memory is formed in a stacking manner, BLs (for example, a BL0 and a BL1) of bit cells at different layers may be connected to a same BL controller, a sense amplifier, and the like, and SLs (for example, an SL0 and an SL1) of bit cells at the different layers may be connected to a same SL controller. For example, a connection of the SLs at the different layers and a connection of the BL at the different layers are implemented using metal wires and through holes. In addition, WLs at different layers may be independent of each other. For example, WLs (for example, a WL0 and a WL1) at different layers are connected to a WL control circuit having a gating function. In addition, the ferroelectric memory may be located at a metal wiring layer, that is, the ferroelectric memory is formed by using a back end of line process, so that the ferroelectric memory and various controllers may be formed by using a same process.

For the foregoing several different ferroelectric memories, different voltages are respectively applied to the source line SL, the bit line BL, and the plurality of word lines WLs through corresponding controllers (or different voltages are applied to the first source 1, the first drain 2, and the other electrode b of each of the plurality of ferroelectric capacitors C). All of the above can implement reading/writing in the plurality of memory cells formed by the plurality of ferroelectric capacitors C. That is, data is written into or data is read from the plurality of memory cells.

Figure 12:
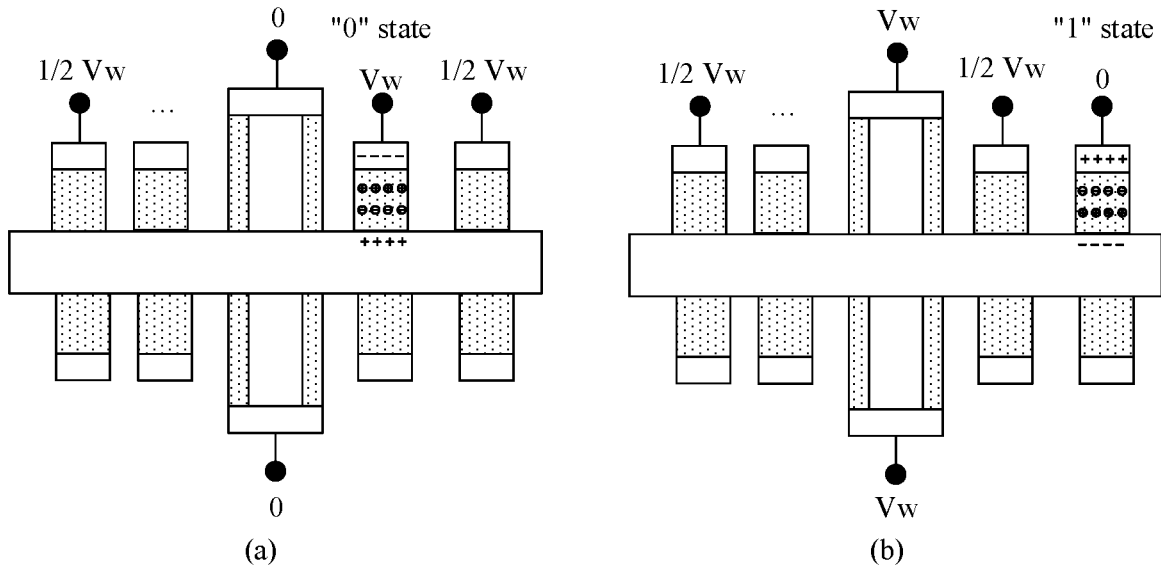
FIG. 12 is a schematic diagram of charges during data reading according to an embodiment of this application.

Specifically, when data is written into a target memory cell in the plurality of memory cells that are formed by one bit cell, an SL and a BL in the bit cell may be set to an equal electrical potential. That is, a voltage difference between the SL and the BL is 0 (for example, a same voltage is applied to the SL and the BL separately). This can suppress a leakage current of a write operation. In addition, a voltage is applied to a WL corresponding to the target memory cell, so that an absolute value of a voltage difference between the WL and the BL that correspond to the target memory cell is equal to a first specified voltage Vw. As shown in (a) in FIG. 12, if a voltage difference between a WL and a BL that correspond to a target memory cell is equal to Vw (for example, an electrical potential of 0 is applied to an SL and the BL separately, and Vw is applied to the WL corresponding to the target memory cell), a ferroelectric dielectric c in the target memory cell is positively polarized, and the target memory cell is written to be in a "0" state. Alternatively, as shown in (b) in FIG. 12, if a voltage difference between a WL and a BL that correspond to a target memory cell is equal to –Vw (for example, Vw is applied to an SL and the BL separately, and an electrical potential of 0 is applied to the WL corresponding to the target memory cell), a ferroelectric dielectric c in the target memory cell is negatively polarized, and the target memory cell is written to be in a "1" state.

In addition, in a process of writing data, for a memory cell in a plurality of memory cells in a bit cell other than the target memory cell, an absolute value of a voltage difference between a WL and a BL that correspond to the another memory cell may be set to less than ½ Vw. This can ensure that a state of the another memory cell remains unchanged. For another bit cell that is in at least one bit cell and into which data does not need to be written, an SL, a BL, and a plurality of WLs in the another bit cell may all be set to ½ Vw, or the SL, the BL, and the plurality of WLs in the another bit cell are in a floating state. In this way, an unselected memory cell may be avoided from being incorrectly written.

Specifically, when data is read from a target memory cell in a plurality of memory cells that are formed by one bit cell, a first gate G1 needs to be precharged before the data is read.

To be specific, the first gate G1 is charged to a specific electrical potential, and then a data reading operation is performed. To be specific, an SL in the bit cell is set to an electrical potential of 0, a BL is set to a second specified voltage $V_{BLR}$, and a WL corresponding to the target memory cell is set to $V_{WLR}$.

Figure 13:
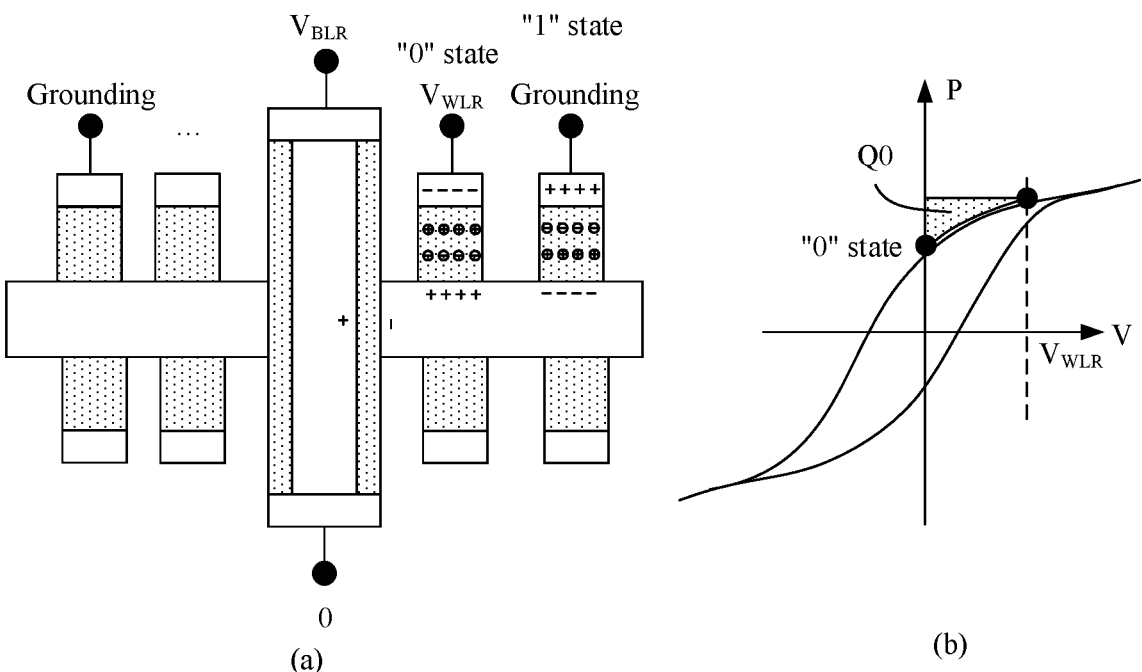
FIG. 13 is another schematic diagram of charges during data reading according to an embodiment of this application.

As shown in (a) in FIG. 13, if data in a target memory cell is "0", positive polarization of a ferroelectric dielectric c in the target memory cell is enhanced. In this case, some positive charges are attracted at a first gate G1 close to the ferroelectric dielectric c, and a small number of negative charges are induced at the first gate G1 close to a first channel CH1. In this case, a small number of positive charges are induced on a surface of the first channel CH1, and a low current is read, that is, the data "0" is read. (b) in FIG. 13 is a schematic diagram of a corresponding polarization state of a ferroelectric medium c displayed when data "0" is read. V represents an applied voltage on a WL corresponding to a target memory cell, P represents a corresponding polarization strength of the ferroelectric medium c, and Q0 represents a variation of polarization charges.

Figure 14:
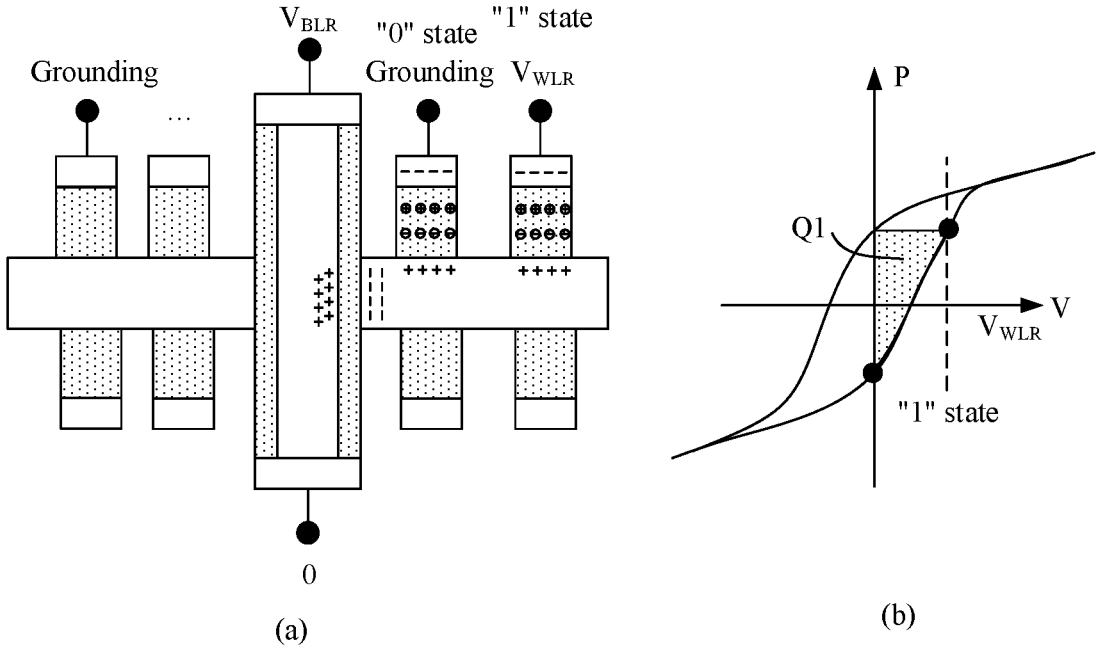
FIG. 14 is still another schematic diagram of charges during data reading according to an embodiment of this application.

As shown in (a) in FIG. 14, if data in a target memory cell is "1", negative polarization of a ferroelectric c in the target memory cell is weakened or changes to a positive polarization state. In this case, a large number of negative charges bound by a ferroelectric in a negative polarization state in a first gate G1 are released, and a large number of negative charges are induced at the first gate G1 close to a first channel CH1. In this case, a large number of positive charges are induced on a surface of the first channel CH1, and a high current is read, that is, the data "1" is read. (b) in FIG. 14 is a schematic diagram of a corresponding polarization state of a ferroelectric medium c displayed when data "1" is read. V represents an applied voltage on a WL corresponding to a target memory cell, P represents a corresponding polarization strength of the ferroelectric medium c, and Q1 represents a variation of polarization charges.

In addition, in a process of reading data, for a memory cell other than a target memory cell in a plurality of memory cells in a bit cell, a WL corresponding to the another memory cell may be grounded or set to be in a floating state. This can ensure that a state of the another memory cell remains unchanged. For another bit cell that is in at least one bit cell and that data does not need to be read, both an SL and a BL in the another bit cell may be set to an electrical potential of 0. This can ensure that no leakage current is generated for an unselected bit cell.

It should be noted that the foregoing process of reading data is implemented by destroying a polarization state of the ferroelectric, to modulate an electrical potential of the first gate G1, and further modulate a read current of a first transistor T1, and is therefore destructive reading. After the data in the target memory cell is read, corresponding data in the target memory cell may be further restored by writing the data. In other words, a data write-back manner is used to ensure that a storage state of the target memory cell is not lost.

Further, the first gate G1 may be precharged in the following several different manners. The following separately describes the several different manners in detail.

Figure 15:
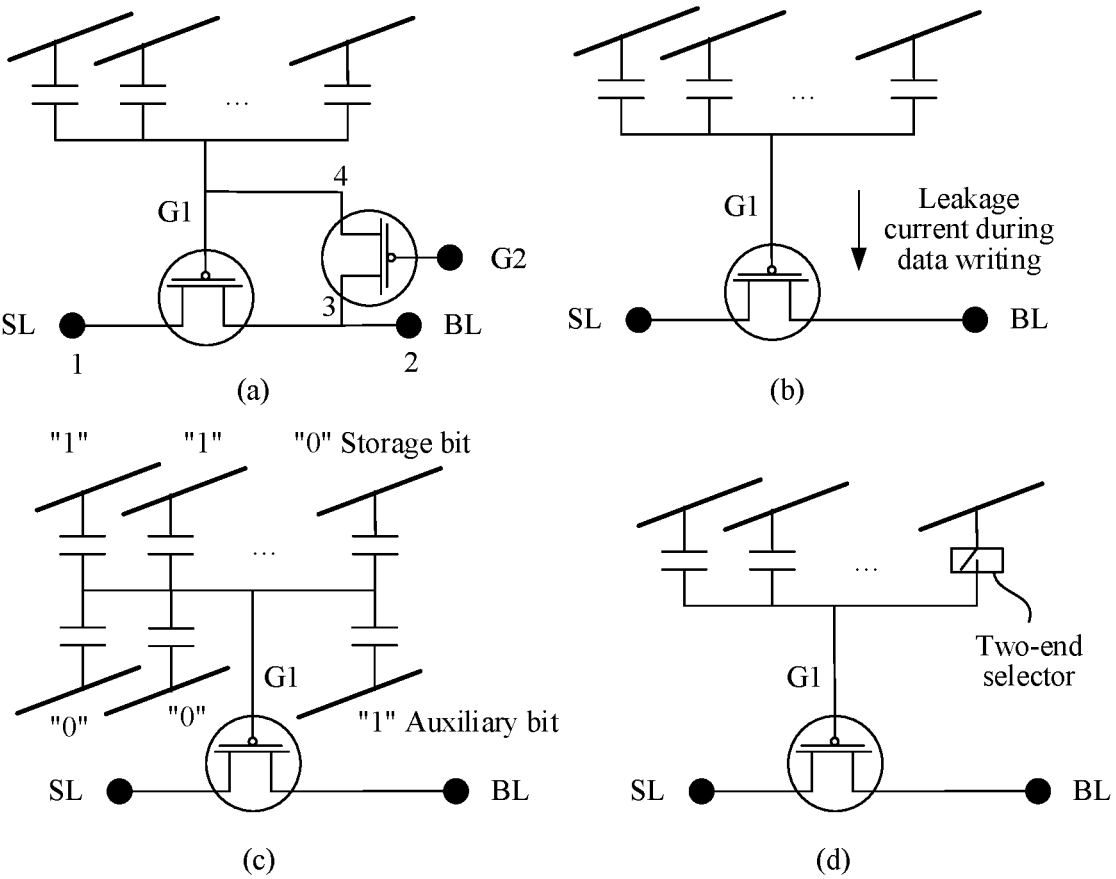
FIG. 15 is a schematic diagram of precharging according to an embodiment of this application.

First manner: As shown in (a) in FIG. 15, each bit cell further includes a second transistor T2. The second transistor T2 includes a second gate G2, a second source 3, and a second drain 4. The second source 3 is connected to a first gate G1, the second drain 4 is connected to a first drain 2, and the second gate G2 is configured to receive a control signal. The second transistor T2 is turned on using the control signal, to precharge the first gate G1. The second transistor T2 may have a same structure as the first transistor T1. For example, the second transistor T2 may also be a GAA transistor. This is not specifically limited in this embodiment of this application.

Second manner: As shown in (b) in FIG. 15, in a process of writing data, an SL and a BL are set to different electrical potentials. That is, the SL and the BL are not at an equal electrical potential. In this way, a first transistor T1 generates a leakage current, and therefore a first gate G1 is precharged using the leakage current.

Third manner: As shown in (c) in FIG. 15, electrical neutrality of a first gate G1 is implemented using an auxiliary bit, which is equivalent to precharging of the first gate G1. To be specific, each memory cell (a storage bit for short) is correspondingly disposed with a corresponding auxiliary memory cell (an auxiliary bit for short), and storage states of the memory cell and the auxiliary memory cell are opposite. For example, if data "1" is stored in one memory cell, data stored in a corresponding auxiliary memory cell is "1". If data "0" is stored in a memory cell, data stored in a corresponding auxiliary memory cell is "0".

Fourth manner: As shown in (d) in FIG. 15, a non-linear two-end selector (for example, a switch or a diode) is serially connected to a first gate G1, and the two-end selector is connected (for example, a switch is turned off or a diode is turned on) to precharge the first gate G1.

Figure 16:
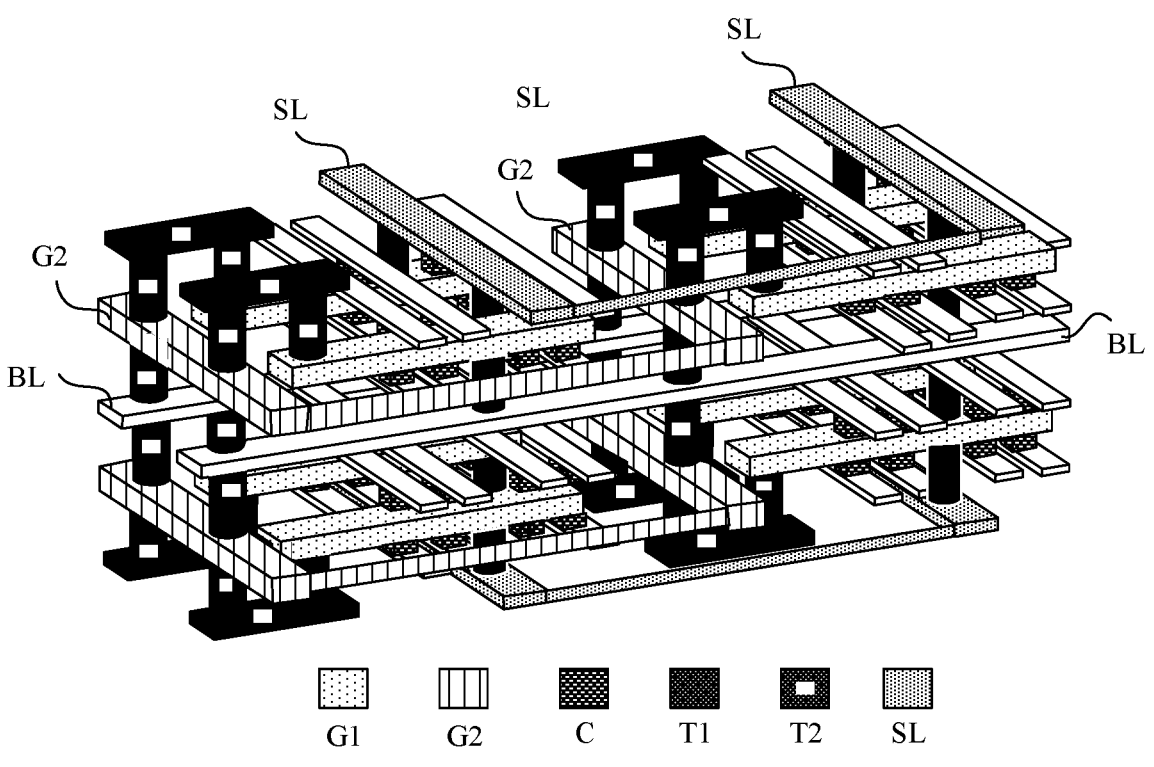
FIG. 16 is a schematic diagram of a structure of a still yet further ferroelectric memory according to an embodiment of this application.

For example, when each bit cell further includes the second transistor T2 in the first precharging manner, a structure of the bit cell may be referred to as a 2TnC structure. As shown in FIG. 16, a three-dimensional stacked ferroelectric memory may also be obtained by combining bit cells of a 2TnC structure. In addition, in the three-dimensional stacked ferroelectric memory, all SLs at a same layer may be connected together, and all second gates G2 at a same layer may be connected together using a same control line CTL. It should be noted that a manner of combining the bit cells of the 2TnC structure is similar to a manner of combining bit cells of a 1TnC structure described above, and details are not described herein again in this embodiment of this application.

Figure 17:
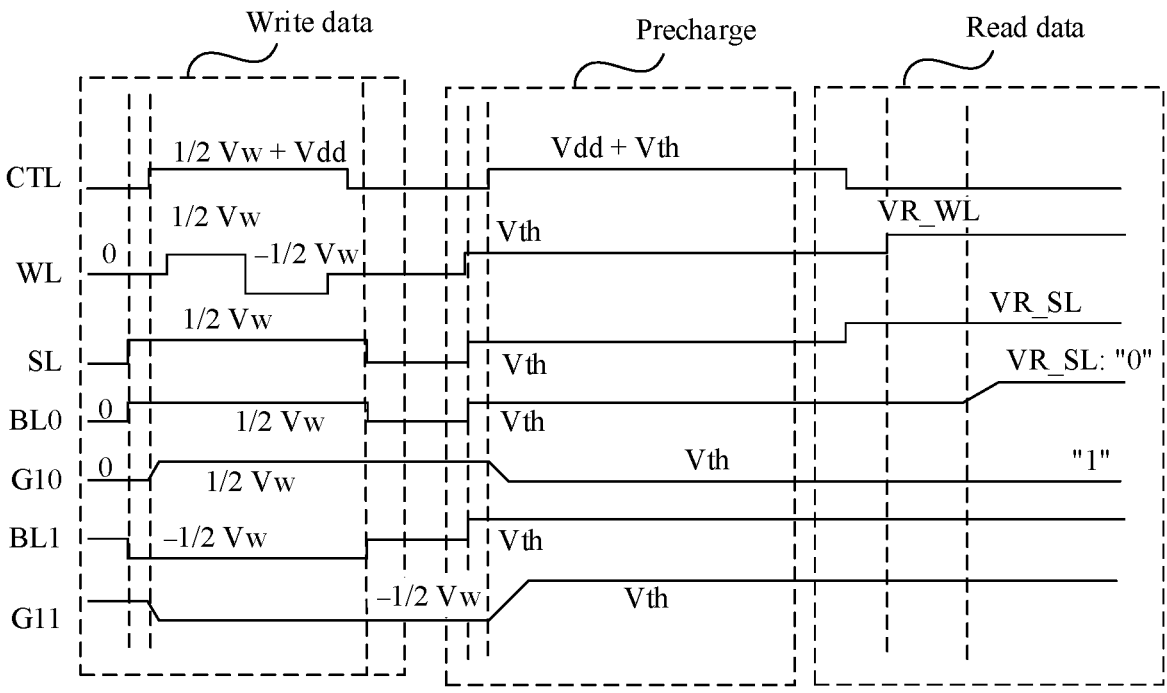
FIG. 17 is a schematic diagram of a voltage applied when data is read or written according to an embodiment of this application.

Specifically, as shown in FIG. 17, for bit cells of a 2TnC structure, when data is written into a target memory cell in a plurality of memory cells that are formed by the bit cells, a specific voltage is applied to a CTL to turn on a second transistor T2, so that an electrical potential on a BL is transferred to a first gate G1. In this case, an SL may be set to ½ Vw. If the electrical potential on the BL is −½ Vw, and a voltage of a WL corresponding to the target memory cell is a positive voltage (for example, ½ Vw), data "0" may be written. Alternatively, if the electrical potential on the BL is ½ Vw, and a voltage of a WL corresponding to the target memory cell is a negative voltage (for example, −½ Vw), data "1" may be written. When the data "0" or "1" is written, the second transistor T2 is always in a turned-off state. A BL0 and a G10 in FIG. 17 respectively represent voltages of corresponding BL and G1 applied when the data "0" is written. A BL1 and a G11 respectively represent voltages of corresponding BL and G1 when the data "1" is written. Vdd represents a fixed power supply voltage, and Vth represents a threshold voltage of the second transistor T2.

Specifically, as shown in FIG. 17, for the bit cells of the 2TnC structure, before data is read from the target memory cell in the plurality of memory cells that are formed by the bit cells, and when the first gate G1 is precharged, the specific voltage may be applied to the CTL, to turn on the second transistor T2, so that the electrical potential (namely, the threshold voltage Vth of the second transistor T2) on the BL is transferred to the first gate G1. An electrical potential on a WL corresponding to the SL and the target memory cell is also set to Vth. In this case, an electrical potential of the first gate G1 may be pulled up to Vth through a precharging operation.

As shown in FIG. 17, when the data is read from the target memory cell in the plurality of memory cells that are formed by the bit cells, the second transistor T2 is turned off. In addition, an electrical potential of the SL is set to VR SL, and an electrical potential of the WL corresponding to the target memory cell is set to VR WL. In this case, if the data "0" is stored in the target memory cell, a polarization state of a ferroelectric is not reversed, the second transistor T2 is turned on, and the electrical potential on the BL gradually rises from Vth to a specific electrical potential. Alternatively, in this case, if the data "1" is stored in the target memory cell, a polarization state of a ferroelectric is reversed, the second transistor T2 is turned off, and the electrical potential on the BL remains Vth. In this way, based on electrical potentials that are of the BL and that correspond to the data "0" and "1", VR SLs corresponding to the data "0" and "1" can be read, where "0" indicates a voltage of the BL when the data is read. The foregoing process of reading is also destructive reading. After the data is read, a read target memory cell may be re-written, to ensure that a storage state of the target memory cell remains unchanged.

In the ferroelectric memory according to embodiments of this application, in the foregoing method for reading from and writing into a memory cell in the ferroelectric memory, if a selected target memory cell is a plurality of memory cells that have a same WL or a same BL, data can also be written or read simultaneously on the plurality of memory cells that have the same WL or the same BL in the foregoing method for reading and writing. Therefore, a reading/writing efficiency of the ferroelectric memory can be greatly improved.

Figure 1:
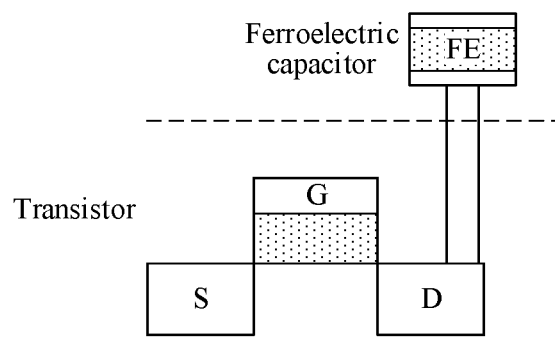
FIG. 1 is a schematic diagram of a structure of a memory cell according to a conventional technology.

In addition, the ferroelectric memory in the foregoing embodiments includes a structure in which one electrode a of each of a plurality of capacitors C is formed on a first gate G1 of a first transistor T1. In another optional embodiment, based on a structure of the first transistor T1 in FIG. 1, one electrode a of each of the plurality of capacitors C may alternatively be formed on a first source 1 or a first drain 2 of the first transistor T1. For example, a ferroelectric memory includes at least one bit cell, and each of the at least one bit cell includes a first transistor and a plurality of ferroelectric capacitors. A quantity of the plurality of ferroelectric capacitors may be n, where n is a positive integer. In this embodiment of this application, the first transistor includes the first gate, a first channel, and the first source and the first drain that are located at two ends of the first channel. One electrode of each of the plurality of ferroelectric capacitors is formed on the first source or the first drain. In other words, in this embodiment of this application, the plurality of ferroelectric capacitors are formed on the first gate or the first source of the first transistor in a bit cell of the ferroelectric memory in a manner similar to that in the foregoing embodiments, and another electrode of each ferroelectric capacitor is connected to a bit line or a source line. In this way, a structure in which a source or a drain of a transistor in a bit cell is coupled to a plurality of bit lines or source lines through a ferroelectric capacitor is formed.

In this embodiment of this application, a manner in which the plurality of ferroelectric capacitors are formed on the first source or the first drain, a manner in which a bit cell is connected to a source line, a bit line, and a word line, and a manner in which a plurality of bit cells are combined in this manner are similar to the manner in which the plurality of ferroelectric capacitors are formed on the first gate, the manner in which the bit cells are connected to the source line, the bit line, and the word line, and the manner in which the plurality of the bit cells are combined that are described in the foregoing specification. For details, refer to a detailed manner in the foregoing embodiments. Alternatively, setting may be performed based on a requirement.

Based on this, an embodiment of this application further provides a storage device. The storage device includes a circuit board and a ferroelectric memory connected to the circuit board. The ferroelectric memory may be any ferroelectric memory provided above. The circuit board may be a printed circuit board (printed circuit board, PCB). Certainly, the circuit board may alternatively be a flexible circuit board (FPC), or the like. The circuit board is not limited in this embodiment. Optionally, the storage device is user equipment or a terminal device of different types such as a computer, a mobile phone, a tablet computer, a wearable device, and a vehicle-mounted device. Alternatively, the storage device may be a network device such as a base station.

Optionally, the storage device further includes a package substrate. The package substrate is fixed on a printed circuit board PCB through a solder ball, and the ferroelectric memory is fixed on the package substrate through the solder ball.

Based on this, an embodiment of this application further provides a storage device. The storage device includes a controller and a ferroelectric memory. The controller is configured to control reading/writing in the ferroelectric memory. The ferroelectric memory may be any ferroelectric memory provided above.

It should be noted that for related descriptions of a three-dimensional ferroelectric memory, refer to the descriptions of the ferroelectric memory in FIG. 2 to FIG. 11. Details are not described in this embodiment of this application again.

In conclusion, the foregoing descriptions are merely specific implementations of this application, but are not intended to limit the protection scope of this application. Any variation or replacement within the technical scope disclosed in this application shall fall within the protection scope of this application. Therefore, the protection scope of this application shall be subject to the protection scope of the claims.

What is claimed is:

1. A ferroelectric memory, wherein the ferroelectric memory comprises at least one bit cell, and the at least one bit cell comprises a plurality of ferroelectric capacitors and a first transistor, wherein:
   the first transistor comprises a first gate, a first channel, a first source, and a first drain, wherein each of the first source and the first drain is located at a respective end of the first channel, and
   a first electrode of each of the plurality of ferroelectric capacitors is formed on the first gate,
   wherein the plurality of ferroelectric capacitors comprise at least one first capacitor and at least one second capacitor, the at least one first capacitor is formed on a first surface of the first gate closer to the first source than a second surface of the first gate, and the at least one second capacitor is formed on the second surface of the first gate away from the first source.

2. The ferroelectric memory according to claim 1, wherein the ferroelectric memory further comprises a bit line, a source line, and a plurality of word lines, the first source is connected to the source line, the first drain is connected to the bit line, and a second electrode of each of the plurality of ferroelectric capacitors is connected to a respective one of the plurality of word lines.

3. The ferroelectric memory according to claim 1, wherein the ferroelectric memory further comprises a first voltage line, a second voltage line, and a plurality of third voltage lines, the first source is connected to the first voltage line, the first drain is connected to the second voltage line, and a second electrode of each of the plurality of ferroelectric capacitors is connected to a respective one of the plurality of third voltage lines.

4. The ferroelectric memory according to claim 1, wherein the first electrode of each of the plurality of ferroelectric capacitors is the first gate.

5. The ferroelectric memory according to claim 1, wherein the plurality of ferroelectric capacitors and the first transistor are disposed at a metal wiring layer.

6. The ferroelectric memory according to claim 1, wherein the ferroelectric memory further comprises a second transistor, wherein the second transistor comprises a second gate, a second channel, a second source, and a second drain, wherein the second source and the second drain are located at two ends of the second channel, the second source is connected to the first gate, the second drain is connected to the first drain, and the second gate is configured to receive a control signal.

7. The ferroelectric memory according to claim 1, wherein the at least one bit cell comprises a first bit cell and a second bit cell, and the first bit cell and the second bit cell are disposed in a stacked manner.

8. The ferroelectric memory according to claim 7, wherein an isolation layer is disposed between the first bit cell and the second bit cell.

9. The ferroelectric memory according to claim 1, wherein:

the plurality of ferroelectric capacitors correspondingly form a plurality of memory cells, and when data is written into a target memory cell in the plurality of memory cells, a voltage difference between the first source and the first drain is equal to 0, and an absolute value of a voltage difference between a second electrode of a ferroelectric capacitor corresponding to the target memory cell and the first drain is equal to a first specified voltage.

10. The ferroelectric memory according to claim 9, wherein:

a second electrode of a ferroelectric capacitor that corresponds to a memory cell other than the target memory cell and that is in the plurality of ferroelectric capacitors is in a floating state, and the first drain is in a floating state; or an absolute value of a voltage difference between the second electrode of the ferroelectric capacitor that corresponds to the memory cell other than the target memory cell and the first drain is less than one half of the first specified voltage.

11. The ferroelectric memory according to claim 1, wherein:

the plurality of ferroelectric capacitors form a plurality of memory cells, and when data is read from a target memory cell in the plurality of memory cells, a bias voltage of the first source is 0, a bias voltage of the first drain is a second specified voltage, and a bias voltage of a second electrode of a ferroelectric capacitor corresponding to the target memory cell is a third specified voltage.

12. The ferroelectric memory according to claim 11, wherein a second electrode of a ferroelectric capacitor that corresponds to memory cell other than the target memory cell and that is in the plurality of memory cells is in the floating state or is grounded.

13. A ferroelectric memory, wherein the ferroelectric memory comprises at least one bit cell, and the at least one bit cell comprises a plurality of ferroelectric capacitors and a first transistor, wherein the first transistor comprises a first gate, a first channel, a first source, and a first drain, wherein each of the first source and the first drain is located at a respective end of the first channel, and a first electrode of each of the plurality of ferroelectric capacitors is formed on one of the first gate, the first source, or the first drain, wherein the plurality of ferroelectric capacitors comprise at least one first capacitor and at least one second capacitor, the at least one first capacitor is formed on a first surface of the first gate closer to the first source than a second surface of the first gate, and the at least one second capacitor is formed on the second surface of the first gate away from the first source.

14. The ferroelectric memory of claim 13, wherein a second electrode of each of the plurality of ferroelectric capacitors is coupled to a respective one of a plurality of source lines or a plurality of bit lines.

15. The ferroelectric memory according to claim 13, wherein the first electrode of each of the plurality of ferroelectric capacitors is the first source; or the first electrode of each of the plurality of ferroelectric capacitors is the first drain.

16. A storage device, wherein the storage device comprises a circuit board and a ferroelectric memory connected to the circuit board, the ferroelectric memory comprises at least one bit cell, and the at least one bit cell comprises a plurality of ferroelectric capacitors and a first transistor, wherein:

the first transistor comprises a first gate, a first channel, a first source, and a first drain, wherein each of the first source and the first drain is located at a respective end of the first channel, and a first electrode of each of the plurality of ferroelectric capacitors is formed on the first gate.

17. A storage device, wherein the storage device comprises a controller and a ferroelectric memory, the controller is configured to control reading/writing in the ferroelectric memory, and the ferroelectric memory comprises at least one bit cell, and the at least one bit cell comprises a plurality of ferroelectric capacitors and a first transistor, wherein:

the first transistor comprises a first gate, a first channel, a first source, and a first drain, wherein each of the first source and the first drain is located at a respective end of the first channel, and a first electrode of each of the plurality of ferroelectric capacitors is formed on the first gate.

18. The storage device of claim 17, wherein the ferroelectric memory further comprises a bit line, a source line, and a plurality of word lines, the first source is connected to the source line, the first drain is connected to the bit line, and a second electrode of each of the plurality of ferroelectric capacitors is connected to a respective one of the plurality of word lines.

19. The storage device of claim 17, wherein the ferro-electric memory further comprises a first voltage line, a second voltage line, and a plurality of third voltage lines, the first source is connected to the first voltage line, the first drain is connected to the second voltage line, and a second electrode of each of the plurality of ferroelectric capacitors is connected to a respective one of the plurality of third voltage lines.

* * * * *